United States Patent [19]

Soga et al.

[11] Patent Number: 4,825,284

[45] Date of Patent: Apr. 25, 1989

[54] SEMICONDUCTOR RESIN PACKAGE STRUCTURE

[75] Inventors: Tasao Soga; Marahiro Goda; Fumio Nakano, Hitachi; Tadao Kushima, Ibaraki; Nobuyuki Ushifusa, Hitachi; Fumiyuki Kobayashi, Sagamihara; Mamoru Sawahata, Hitachi, all of Japan

[73] Assignee: Hitachi, Ltd., Tokyo, Japan

[21] Appl. No.: 940,485

[22] Filed: Dec. 10, 1986

[30] Foreign Application Priority Data

Dec. 11, 1985 [JP] Japan .................................. 60-276807

[51] Int. Cl.$^4$ ............................................. H01L 39/02
[52] U.S. Cl. ......................................... 357/80; 357/81; 357/82; 357/72
[58] Field of Search .......................... 357/80, 81, 82, 72

[56] References Cited

U.S. PATENT DOCUMENTS 4,604,644  8/1986  Beckham et al. ..................... 357/72
4,667,220  5/1987  Lee et al. ............................... 357/80

FOREIGN PATENT DOCUMENTS 59996   1/1984  Japan ..................................... 357/81
31046   2/1984  Japan ..................................... 357/81
6063951 4/1985  Japan ..................................... 357/81
257156 12/1985  Japan ..................................... 357/81

Primary Examiner—Martin H. Edlow
Attorney, Agent, or Firm—Antonelli, Terry & Wands

[57] ABSTRACT

A semiconductor resin package structure formed according to the flip-chip connection method and permitting to cool the rear surface of semiconductor chips, comprising semiconductor chip and carrier substrate which is soldered on one surface thereof to electrodes of the semiconductor chip according to the flip-chip connection method, the gap between the semiconductor chip and the carrier substrate being filled with resin having a thermal expansion coefficient, which is approximately equal to that of used solder, the electrodes of the semiconductor chip being electrically connected with terminals on the other surface of the carrier substrate through the soldered portions and a through-hole conductor disposed on the carrier substrate, the thermal expansion coefficient of the carrier substrate being approximately equal to that of a multi-layer substrate, with which the substrate is connected by soldering with the terminals.

20 Claims, 6 Drawing Sheets

SEMICONDUCTOR RESIN PACKAGE STRUCTURE

BACKGROUND OF THE INVENTION

1. Field of the Invention

This invention relates to a novel semiconductor resin package structure used for logic LSI in the central processing unit of extra-large computers etc.

2. Description of the Prior Art

Recently there is a tendency that it is required to increase the number of terminals and it is thought that the flip-chip is promising as an LSI system responding thereto. The flip-chip method is one, by which a glass film is formed on the surface of a semiconductor chip of LSI after having finished wiring therein, and electrodes are taken out through holes formed therein and has features that it is possible to take out a number of terminals and that the wiring may be short. In the case where LSIs are mounted on a multi-layer substrate, it is a problem whether it is easy or not to exchange chips in the contact portion between the semiconductor chips and the multi-layer substrate because of the difference between the thermal expansion coefficient of the semiconductor chips and that of the multi-layer substrate. In general, the thermal expansion coefficient of the multi-layer substrate is greater than that of the semiconductor chips and stress is concentrated in the solder in the contact portion connecting the semiconductor chips with the multi-layer substrate because of the difference between the thermal expansion of the semiconductor chips and that of the multi-layer substrate due to heat production during use of the semiconductor chips, and this gives rise to strain therein and destroys the solder. This problem becomes more remarkable, specifically when the semiconductor chips are made larger and their packing density is increased. Further, in the production of apparatuses using LSIs, a semiconductor chip of LSI is connected with a substrate for inspection and reconnected with a multi-layer substrate after its inspection. In this case it may happen often that deficiencies are found in the LSI during the inspection after the connection of the semiconductor chip with the multi-layer substrate and that it is necessary to exchange semiconductor chips of LSI. Furthermore, after the apparatuses have been delivered to a user, it may become necessary to exchange semiconductor chips. Since, in the LSI according to the flip-chip method, the electrodes and solders on the surface of the chip are formed by evaporation, once they are soldered, damage is remarkable, when they are disconnected and soldered again, and thus it is extremely difficult to repeat the reforming of the solder. Further, if the chip is exposed to the atmosphere after the connection, the reforming of the solder is difficult because of the sticking of dust, etc. also it is difficult to secure a certain amount of solder by evaporation.

Heretofore a structure, by which a semiconductor chip having the flip-chip structure is cooled from the rear side, has been proposed in Japanese Patent Examined Publication No. 56-31743. For this structure, metallization is made on the rear surface of the semiconductor chip and this rear surface is adhered on a cooling stud. Although the cooling effect obtained by the flip-chip method is sufficient, in the case where large sized chips are used, there is a problem that their life is shortened by thermal fatigue due to the difference between the thermal expansion coefficient of the chips and that of the multi-layer substrate. For example, when a semiconductor chip of 5 mm square (the distance between the outermost solder bumps is 6.5 mm) is connected on an $Al_2O_3$ substrate, whose thermal expansion coefficient $\alpha$ is $6.8 \times 10^{-6}$/°C., by the flip-chip method, a number of cycles of 1000 is the limit for maintaining the chip structure to be normal during a temperature-cycle acceleration test of 1 hour per cycle (1 h/∞) at a temperature range between $-55°$ and $150°$ C. In the case where the size of the chips is increased, the number of cycles is considerably reduced. That is, the life of the chip structure is remarkably shortened, and this gives rise to a problem in practice. With increasing capacity and speed-up of the computer the number of logic gates formed on a semiconductor chip increases and its wiring pitch becomes smaller or dense. At the same time it is required to mount large size chips of about 10 mm square having an output power higher than 20 W/chip and to realize a mounting method for mounting large sized flip-chips on a multi-layer substrate with a high reliability. However, the flip-chip structure disclosed in Japanese Patent Examined Publication No. 56-31743 doesn't fulfill this requirement. In addition, it is difficult to change the connection of the semiconductor chips with the multi-layer substrate and therefore the flip-chip structure lacks the facility of chip repair (dismounting and reconnection).

In Japanese Patent Unexamined Publication No. 59-996 it has been proposed a connection structure of the substrate for alleviating stress concentration to the solder bump in the connection portion and strain in the solder bump due to the difference between the thermal expansion coefficient of the chips and that of the substrate, in the case where the semiconductor chips are connected with a circuit substrate, where an intermediate substrate, whose thermal expansion coefficient is greater than that of the semiconductor chips and smaller than that of the substrate made of a substance belonging to the $Al_2O_3$ family, is disposed between the semiconductor chips and the multi-layer substrate made of a substance belonging to the $Al_2O_3$ family, and the semiconductor chips and the intermediate substrate as well as the intermediate substrate and the multi-layer substrate are connected by soldering, respectively so that the stress concentration and the strain produced by heat are dispersed between the semiconductor chips and the intermediate substrate and also between the intermediate substrate and the multi-layer substrate. However, the problem of the stress and strain still remains for this structure and reconnection of the semiconductor chips is not taken into consideration. It is supposed that a plurality of semiconductor chips are connected with the intermediate substrate. Therefore, there is another problem that, when exchange of semiconductor chips is effected for every intermediate substrate, it is necessary to exchange a plurality of semiconductor chips in order to exchange one semiconductor chip, and this raises the cost. Furthermore, it is supposed that the semiconductor chips are exposed to the atmosphere after the connection of the semiconductor chips. With this respect also it is difficult to reconnect the semiconductor chips.

In Japanese Patent Unexamined Publication No. 60-63951 it has been proposed a semiconductor device, in which, when semiconductor chips are connected with solder to a substrate made of epoxy resin, etc., the gap between the semiconductor chips and the substrate is filled with resin having a thermal expansion coefficient, which is approximately equal to that of the solder, which resin surrounds also the semiconductor chips, and in this way stress and strain due to the difference between the thermal expansion coefficient of the semiconductor chips and that of the substrate are dispersed by the resin so that stress applied to the solder bump and strain therein are dispersed. Here it is possible to reduce remarkably stress applied to the solder bump and strain therein. However, it is not possible to reconnect the semiconductor chips and when either one of the semiconductor chips should be replaced by another, after having once connected a plurality of semiconductor chips with the substrate, it is necessary to replace them for every substrate.

SUMMARY OF THE INVENTION

The object of this invention is to provide a semiconductor resin package structure, in which high output power and large size chips are flip-chip-connected with a multi-layer substrate, the rear surface of the chips being directly or indirectly cooled by liquid, and which is excellent in heat-fatigue-resistance reliability and chip repair facility.

The semiconductor resin package structure according to this invention has a face-down structure so that the rear surface of the chips can be cooled by liquid, comprising carrier substrates having a thermal expansion coefficient, which is approximately equal to that of the multi-layer substrate, for every semiconductor chip, the electrodes on the front surface of each of the semiconductor chips being soldered on one surface of each of the carrier substrates so that the terminals on the other surface of the carrier substrates connected electrically with the electrodes on the chips via through-hole conductors of the carrier substrates being soldered to the multi-layer substrate, the gap between the semiconductor chips and the carrier substrates being filled with resin having a thermal expansion coefficient, which is approximately equal to that of the solder. It is preferable that the deviation of the thermal expansion coefficient of the resin from that of the solder is not greater than 30% of the latter.

According to the conventional flip-chip method using naked chips, stress was concentrated in the outermost solder bump in the connection portion between the semiconductor chips and the substrate. To the contrary, according to this invention, stress is dispersed in the resin by the fact that the gap between the semiconductor chips and the carrier substrates is filled with resin, whose thermal expansion coefficient is approximately equal to that of the solder, so that shearing stress applied to the solder bump and strain therein can be reduced. Further, owing to the fact that the thermal expansion coefficient of the carrier substrates is approximately equal to that of the multi-layer substrate, no problem is produced concerning the thermal expansion in the connection of the carrier substrates with the multi-layer substrate. Consequently, the life of the connection of the semiconductor chips with the multi-layer substrate can be elongated and even in the case where large sized chips are used, for a period of 10 to 15 years, which is thought to be the required life for the computer, the semiconductor device thus constructed can maintain its connection with a high reliability. Furthermore, it is necessary that the bending rigidity of the carrier substrates is so great that the bending rigidity of the semiconductor chips can be neglected and that no problematically great stress is produced by thermal deformation of the silicon chips in the connection portion due to soldering between the multi-layer substrate and the carrier substrates. The difference between the thermal expansion coefficient of the carrier substrate and that of the ceramic multi-layer substrate should be smaller than $2 \times 10^{-6}/°C$. and in particular it is preferably smaller than $1 \times 10^{-6}/°C$.

The terminals of the carrier substrates are different from the electrodes of the semiconductor chips and they are formed from a thick film by the baking method, which stand several reformings of the solder. Consequently, according to this invention, it is possible to replace the semiconductor chip connected through the carrier substrate with the multi-layer substrate arbitrarily for every chip and to provide a package, which can be easily repaired.

According to this invention the problem of the thermal stress due to the difference between the thermal expansion coefficient of the semiconductor chip and that of the multi-layer substrate can be resolved and it is possible to connect large sized chips of 10 mm square with a multi-layer substrate having a thermal expansion coefficient as great as that of $Al_2O_3$, which is about $\alpha = 10\text{-}15 \times 10^{-6}/°C.$, such connection having been impossible according to the prior art techniques, with a long life and a high reliability. Consequently it is possible to mount semiconductor chips also on an organic multi-layer substrate (e.g. substrate made of a resin belonging to the teflon family) having a low dielectric constant. Further, since the reliability of the metallization is ameliorated by forming a micropackage, in which each of the semiconductor chips is mounted on a carrier substrate, the device according to this invention is excellent in facility of maintenance, repair, inspection, etc. and this invention contributes considerably to the high reliability of the device.

In order to lower the thermal expansion coefficient of the resin to that of the solder, it is preferable to make it contain quartz powder of 30-60 vol. %. The quartz powder should be finer than 100 mesh and its grain size is preferably smaller than 10 μm. Further mixing of fine spheric grains of polybutadiene gum in the resin has effects to alleviate stress due to thermal shock and to lower the Young's modulus and contributes to elongate the life of the solder junction portion.

The thermal expansion coefficient of the carrier substrates should be approximately equal to that of the solder and it is preferable that the deviation of the thermal expansion coefficient of the carrier substrates from that of the solder is not greater than 30% of the latter. The carrier substrates may be made of ceramics, etc.

BRIEF DESCRIPTION OF THE DRAWINGS

These and other objects and advantages of the present invention will become apparent by reference to the following description and accompanying drawings, wherein:

FIG. 9b is an enlarged cross-sectional view of a part of FIG. 9a.

DESCRIPTION OF THE PREFERRED EMBODIMENTS

Before some embodiments of the semiconductor resin package structure according to this invention are described, the flip-chip structure according to prior art techniques will be described.

Figure 1:
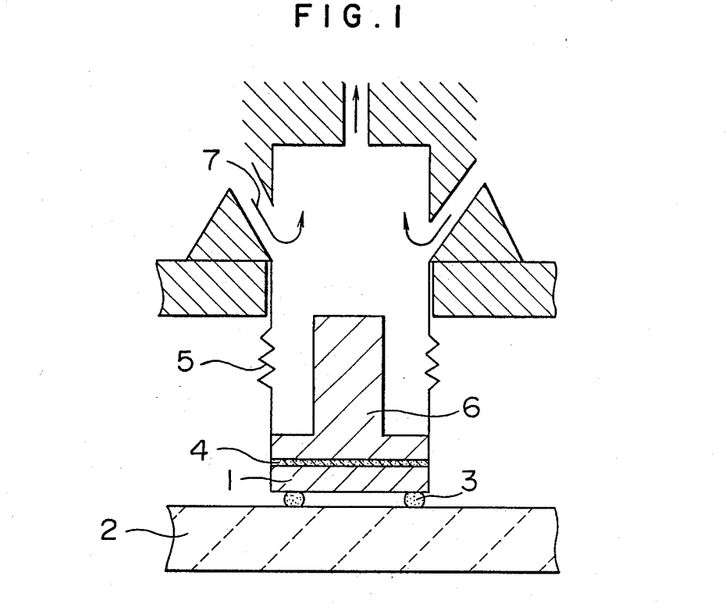
FIG. 1 is a cross-sectional view of a prior art module mounting structure.

FIG. 1 illustrates an example of prior art flip-chip structures, which is cooled through the rear surface of the chip, in which the reference numeral 1 denotes an Si chip; 2 a multi-layer substrate; 3 a solder; 4 a low melting point solder; 5 an Ni bellows; 6 a cooling stud; and 7 a cooling water. In this flip-chip structure, as described in Japanese Patent Examine Publication No. 56-31743, the rear surface is metallized and the Si chip 1 is jointed to the cooling stud 6 through the low melting point solder 4.

The cooling effect according to the flip-chip method is sufficiently good. However, in the case where large sized chips are used, their short life provoked by thermal fatigue due to the difference between the thermal expansion of the chips and that of the multi-layer substrate give rise to a problem. In the case where large sized high output power chips of about 10 mm square are mounted, the life of the junction portion of the chips with the multi-layer substrate is considerably shorter than that required for computers and further there is a problem that it is not easy to repair the chips.

Figure 2:
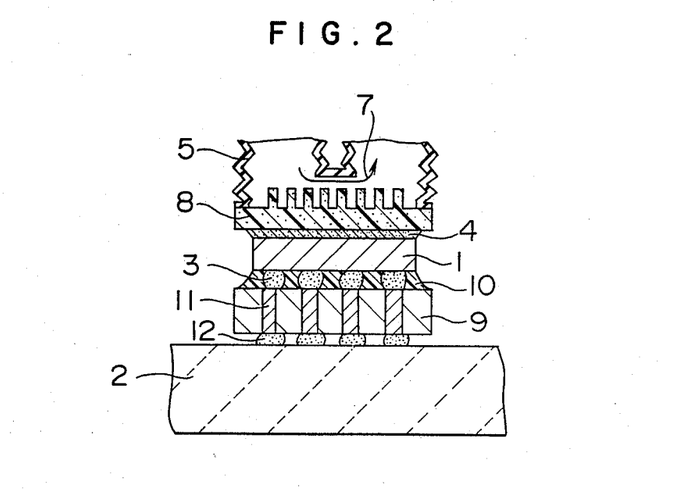
FIG. 2 is a cross-sectional view of a module mounting structure utilizing an embodiment of semiconductor resin package structure according to this invention.

FIG. 2 illustrates a module mounting structure using an embodiment of semiconductor resin package structure according to this invention, in which the Si chip 1 is jointed to the Si chip cooling plate 8 through the low melting point solder 4 at its rear surface. The cooling plate 8 is jointed to the nickel bellows 5 and cooled with water 7. The electrodes on the front surface of the Si chip 1 are connected on the upper surface of a carrier substrate 9 by means of solder (Pb-5% Sn) and the gap between the Si chip 1 and the carrier substrate 9 is filled with resin 10. The soldered portions on the upper surface of the carrier substrate 9 and the portions on the lower surface of the carrier substrate 9, which are connected electrically via a through-hole conductor 11, are connected with the multi-layer substrate 2 by means of solder 12 (Pb-60% Sn), where they are connected with a predetermined printed circuits on the multi-layer substrate 2. In the structure indicated in FIG. 2 the Si chip 1 and the carrier substrate 9 connected by the solder 3, the gap between which is filled with the resin 10, constitute a semiconductor resin package structure.

The resin 10 has, as explained later in detail referring to FIG. 3b, a composition, which is a mixture of epoxy resin and quartz powder, etc., having a thermal expansion coefficient approximately equal to that of the solder 3. The multi-layer substrate 2 is made of $Al_2O_3$ and the carrier substrate 9 is made of $Al_2O_3$, mullite ($Al_2O_3$.-$SiO_2$), etc. having a thermal expansion coefficient approximately equal to that of the multi-layer substrate 2. The composition of the solder 12 differs from that of the solder 3 and has a melting point, which is so low that reconnection using it can be effected easily. The problem provoked by the thermal stress due to the difference between the thermal expansion coefficient of the semiconductor chip 1 and that of the multi-layer substrate 2 is resolved by the fact that the thermal expansion coefficient of the resin 10 is approximately equal to that of the solder 3 so that stress is dispersed and that the thermal expansion coefficient of the carrier substrate 9 is approximately equal to that of the multi-layer substrate 2 so that no thermal stress provoking a problem is produced between the carrier substrate 9 and the multi-layer substrate 2. Further, at the same time the semiconductor chips 1 together with the carrier substrates 9 can be exchanged easily for every semiconductor chip by reconnecting it with the multi-layer substrate 2 by means of solder and furthermore it is possible to effect easily and economically inspection and maintenance of the semiconductor chips or devices in which the semiconductor chips are used.

In this embodiment the multi-layer 2 consists of 30 layers using tungsten (W) conductors, whose surface conductor layer is made of tungsten (W) plated with nickel (Ni) and coated with gold (Au). The carrier substrate 9 consists of 4 layers and the through-hole conductor 11 is made of a layer plated with copper and thereafter plated by dip with solder. An $SiO_2$ film is formed on an Al film on the surface of the semiconductor chip 1. This $SiO_2$ film is removed at the portions corresponding to the electrodes and a thin film of Cr-Cu-Au is used, for which Cr, Cu and Au are 0.1 μm, 3 μm and 0.1 μm thick, respectively.

The rear surface of the Si chip can be so constructed that it can be cooled directly or indirectly by liquid, or differently from the structure indicated in FIG. 2 it can be cooled by air or liquid through metal, ceramics, etc., which are good heat conductors.

Now some embodiments of this invention will be explained below further in detail.

Figure 3A:
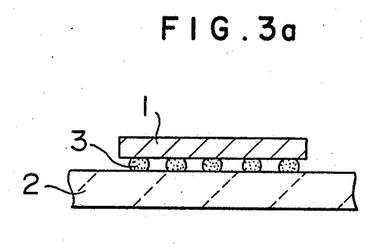
FIG. 3a is a cross-sectional view of the junction portion between a semiconductor chip and a multi-layer substrate in the prior art module mounting structure.
Figure 3B:
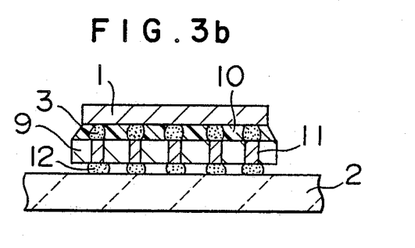
FIG. 3b is a cross-sectional view of the structure, by which a semiconductor resin package and a multi-layer structure are connected, according to this invention.
Figure 3C:
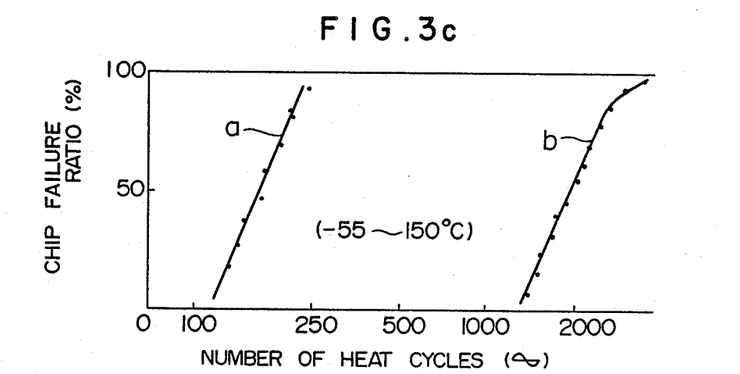
FIG. 3c shows two curves representing the chip failure ratio vs. the number of heat cycles for the structures indicated in FIGS. 3a and 3b, respectively.

FIGS. 3a to 3c are schemes for explaining results of heat cycle acceleration tests under conditions of −55° to 150° C. and 1 h/∞. FIG. 3a illustrates a prior art structure (naked chip), in which a 10 mm square chip 1 is soldered to an $Al_2O_3$ substrate 2. FIG. 3b illustrates a structure according to this invention, for which a chip is soldered on a carrier substrate 9 made of $Al_2O_3$; then the gap between the chip and a carrier substrate is filled with resin 10; and thereafter the carrier substrate is mounted on an $Al_2O_3$ multi-layer substrate 2 with low melting point solder 12.

FIG. 3c indicates results of acceleration tests, from which it can be seen that the life of the chip-carrier structure indicated in FIG. 3b is ten times as long as that of the naked chip structure indicated in FIG. 3a. It is thought that this absolute value of the acceleration test is so long that it meets the requirement of the working life of the computer, which is usually 15 years long.

Further, in the structure indicated in FIG. 3b, although both the carrier substrate and the multi-layer structure are made of $Al_2O_3$, other materials can be used therefore. A structure, for which no thermal fatigue is produced in the junction portion 12 between the carrier substrate and the multi-layer substrate, can be obtained by using carrier substrates having a thermal expansion coefficient, which is equal or approximately equal to that of the multi-layer substrate. In this case, it is necessary that the flexural rigidity of the carrier substrate is greater than that of Si chips. In this way the carrier substrate is not warped and the high reliability can be maintained.

The through-hole conductor 11 on the carrier substrate may have a structure obtained by carrying out dip solder plating after copper plating, by sintering paste of W, Mo, Co, etc., or by burying pin elements therein.

The principal reason, why the chip carrier structure has a resistivity against the thermal fatigue, which is higher than that of the structure using naked chips, is thought from results of thermal elasticity-plasticity analysis according to the finite element method that (1) the resin alleviates stress concentration in a part of the solder bump;

(2) the thermal expansion coefficient of the resin is in agreement in that of the solder;

(3) the fine spherical grains of polybutadiene gum dispersed in the resin alleviate thermal shocks, etc.

The composition of used resins is as follows:

| | |
|---|---|
| Epoxy resin 828 | 100 parts |
| Polybutadiene (CTBN) | 15 parts |
| Dicyandiamide | 10 parts |
| Imidazole (2P4MHZ) | 5 parts |
| A-187 | 2 parts |
| Quartz powder (EMC-Y40) | 55 vol. % |

This resin has a thermal expansion coefficient, which is as low as that of the solder. It has a high fluidity and thus can penetrate into the gap between the chips and the carrier substrates by the effect of the surface tension so as to fill the gap. Since the resin conventionally used for the dual inline package is injected with pressure according to the casting method, it is necessary that its separability from the die is good. Further, because of the face-up connection method for the chips, the penetration of the resin gives rise to no important problem and no special consideration is given to the fluidity.

For this reason, the intimate adhesion of the resin at the interface of the lead decreases and moisture penetrates into the package along the interface by effects of thermal shocks, heat cycles, etc. so as to corrode Al conductor portions on the surface of the chip, what provokes troubles due to breaking of leads.

However, in the flip-chip structure in which the composition of the resin is used, because of the facedown connection method for the chips, since it is necessary to make the resin penetrate into gaps as narrow as about 100 μm between the chips and the carrier substrates by using the effect of the surface tension, the used resin has a high fluidity (about 10 times as high as mold resins) and an intimate adhesion with the Si chips and the carrier substrates. In this wa the structure has a good anticorrsive property and penetrate of the moisture thereinto is little.

When the temperature in the heat cycle test condition is changed from 150° C. to −55° C., concerning the distribution of the principal stress acting on the neighborhood of the outermost solder bump in the junction portion between the semiconductor chip 1 and the carrier substrate 9, in the prior art flip-chip structure (naked chips without resin), stress concentration is produced at the interface between the outer side of the solder bump and the chip-substrate, and this gives rise to cracks and leads to breaking of wiring. Great and small principal stresses appear remarkably, depending on the position and especially great stress concentration is recognized at the interface of the junction.

To the contrary, in the flip-chip structure according to this invention, the principal stress concentration is only scarcely influenced by the position and a state where the principal stress is nearly uniformly distributed is observed. Further, no stress concentration at the junction interface is recognized and the magnitude of the stress is small with respect to the prior art structure.

For this reason it is thought that the effect of the resin alleviates the stress concentration applied to the solder bump and disperses the stress, and this elongates the life determined by the thermal fatigue.

Figure 4:
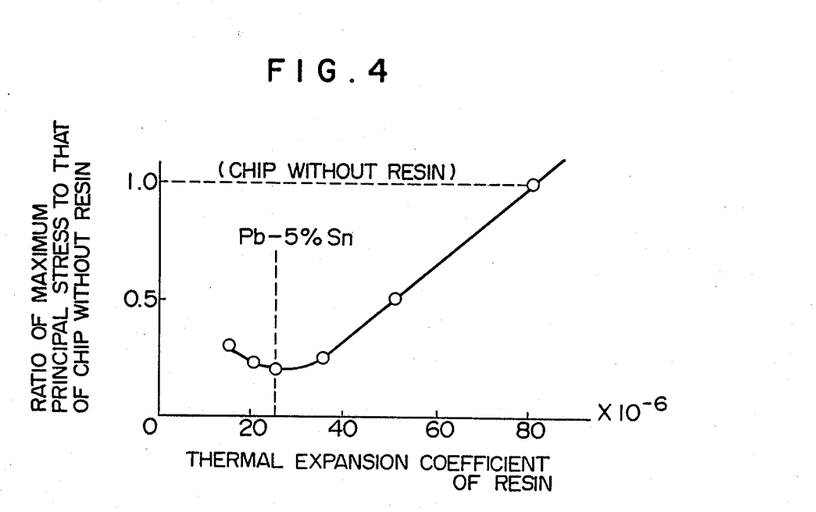
FIG. 4 shows a graph representing the ratio of the maximum principal stress acting on the solder bump in the semiconductor resin package structure according to this invention to the maximum principal stress acting on the solder bump in the prior art chip structure without resin vs. the thermal expansion coefficient of the resin.

FIG. 4 indicates, at the next effect, the ratio of the maximum principal stress acting on the outermost solder bump to that in the prior art chip structure (without resin) for various thermal expansion coefficients of the resin used in the resin filled chip.

It can be seen that the maximum principal stress applied on the solder is smallest, when the thermal expansion coefficient of the resin is in agreement with that of Pb-5% Sn solder. This means that the maximum principal stress increases, when the thermal expansion coefficient is smaller than this value, too. However, since the stress applied to the Si chip (element) acts naturally more strongly with increasing thermal expansion coefficient of the resin, it is desirable that it is small with respect to that of the Si chip. However, there are known heretofore no examples of problems in the element, in which the resin has a thermal expansion coefficient equal to that of the solder, for dual inline package, etc.

The selection of the composition of the resin is so effected that, as indicated in Japanese Patent Unexamined Publication No. 60-63951 in detail, the resin has a thermal expansion coefficient of about $25 \times 10^{-6}/°C$. in agreement with that of the solder (Pb-5% Sn). The fact that the thermal expansion coefficient of the resin is equal to that of the solder means that the solder bump itself is not restricted by the resin, that stress concentration is reduced, and that consequently stress applied to the solder itself and strain therein are small. However, since stress due to the difference between the thermal expansion coefficient of the resin and that of Si is applied to the Si element itself and strain is produced therein, it is desirable that the thermal expansion coefficient is small. But, even if they are in agreement with each other, the level of produced stress and strain is not so high that they constitute any hindrance.

What is required as the condition of the resin for the carrier substrate other than the thermal expansion coefficient of the resin, which is as low as that of the solder, is the fluidity permitting for the resin to penetrate into the gap between the chips and the carrier substrates, threading its way through barriers formed by solder bumps distributed in the form of checkers therebetween so that no space not filled with the resin remains.

When the amount of quartz powder etc. mixed with the epoxy resin is increased in order to lower its thermal expansion coefficient, its fluidity decreases. (For obtaining the thermal expansion coefficient, which is approximately equal to that of the solder, the content of the quartz powder should be about 55 vol. %.) This decrease of the fluidity can be restrained by dispersing spheric grains of 1–5 $\mu m\phi$ of polybutadiene gum as means for increasing the fluidity. However, when the content of polybutadiene gum exceeds 20%, its dispersion cannot be maintained but a part of it begins to coagulate. Since the thermal expansion coefficient of polybutadiene gum itself is great ($80 \times 10^{-6}/°C.$), excessive polybutadiene exerts disadvantageous influences upon the resin.

It is described in Japanese Patent Unexamined Publication No. 60-63951 that polybutadiene gum ameliorates the fluidity, alleviates thermal shocks, and raises the property against the thermal fatigue, when the content of the polybutadiene gum is smaller than 20%.

This mechanism can be explained by the fact that, when the temperature varies rapidly (e.g. 150° C.→room temperatures→−55° C.) shock-like stress on the chips, the substrates, the solder, etc. can be alleviated by the elastic action of this gum.

Table 1 shows the relation between the content of quartz powder, which is a material lowering the thermal expansion, as well as the content of polybutadiene serving as buffer as the composition of the resin and the life determined by the thermal fatigue (o: good, Δ: fairly good, x not good).

TABLE 1

| Quartz powder | Polybutadiene (wt. %) | | | | | | |
|---|---|---|---|---|---|---|---|
| (vol. %) | 0 | 1 | 5 | 10 | 15 | 20 | 25 |
| 0 | x | x | x | x | x | x | x |
| 10 | x | x | Δ | Δ | x | x | x |
| 20 | x | Δ | Δ | Δ | Δ | x | x |
| 30 | x | Δ | o | o | o | Δ | x |
| 35 | x | Δ | o | o | o | Δ | x |
| 40 | x | Δ | o | o | o | Δ | x |
| 50 | x | Δ | o | o | o | Δ | x |
| 55 | x | Δ | o | o | o | Δ | x |
| 60 | x | x | Δ | o | o | Δ | x |
| 65 | x | x | Δ | Δ | Δ | x | x |

The limit of the content of quartz powder with respect to the whole resin is 60–65 vol. % and that of polybutadiene is 20 wt. %. However the content of quartz powder is preferably 30–60 vol. % and that of polybutadiene is 5–15 wt. %.

Further carbon black is added to the resin to the extent of about 1–2% for blackening the resin.

In addition at least one selected from the group consisting of alumina, silicon carbide, silicon nitride, aluminium nitride, calcium carbonate and silicon carbide mixed with beryllium oxide can be used as the material for lowering the thermal expansion coefficient other than quartz.

At least one selected from the group of polyisoprene and silicone can be used as the elastic material other than polybutadiene.

Concerning the form of the solder bump, when elongation of the life of the solder bump and facility of the penetration of the resin are taken into consideration, an hour glass shape, which is formed by enlarging the gap between the chip and the carrier, when the solder is melted, is more preferable than a partially cut off sphere. In this way the reliability is further ameliorated and work with resin is facilitated.

FIGS. 5a to 5f illustrate various kinds of application examples of the semiconductor resin package structure, where the junction of the rear surface of the chip with a cooling plate and the junction of the carrier substrate with the multi-layer substrate are omitted.

Figure 5A:
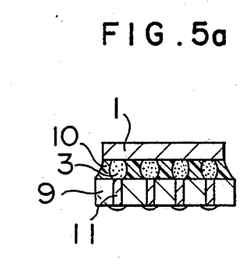
FIGS. 5a to 5f are schemes showing various kinds of application examples of the semiconductor resin package structure according to this invention.

FIG. 5a illustrates a structure, in which the resin is adhered only to the lower surface of the chip.

Figure 5B:
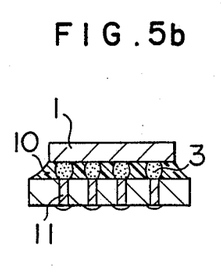

FIG. 5b illustrates a structure, in which the resin is adhered not only to the lower surface of the chip but also to the side surface of the chip.

Figure 5C:
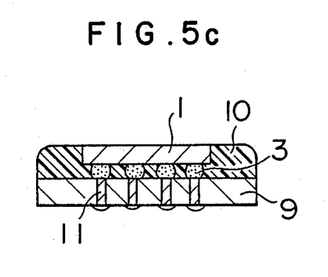

FIG. 5c illustrates a structure, in which the resin covers the part below the rear surface of the chip. In this structure heat conduction through the resin surface can be somewhat expected by using a high heat conductivity resin.

Figure 5D:
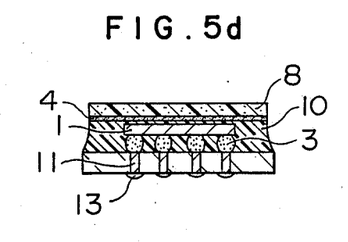

FIG. 5d illustrates a structure, in which the rear surface of the chip is soldered or adhered with a heat conductive plate (e.g. made of heat conductive electrically isolating SiC). By this structure it is possible to obtain effects to increase the heat conductivity by ameliorating the heat conduction in the transverse direction, to protect mechanically the rear surface of the chip, to ameliorate the wetproof property, etc.

Figure 5E:
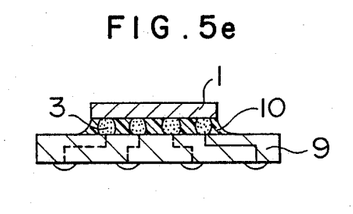

FIG. 5e illustrates a structure, in which the carrier substrate has a pitch matching function, in the case where the terminal pitch on the multi-layer substrate side is large.

Figure 5F:
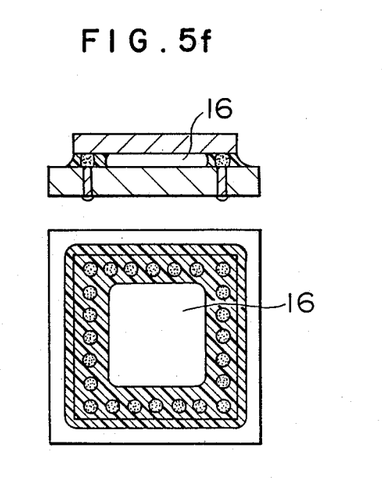

FIG. 5f illustrate an example, in which connection terminals are arranged on the periphery, where the resin covers the solder bump, but the central portion 16 is hollow. The figure shows a front view and a plan view. Since it is verified that its resistance against heat cycle is approximately equal to that of the structure filled with resin, it is clear that this type of structures has the same effect.

Figure 6A:
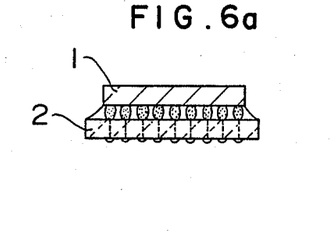
FIGS. 6a and 6b are cross-sectional views of two different package structures, in the case where the semiconductor resin package structure according to this invention is mounted on the stud type multi-stage module structure.
Figure 6B:
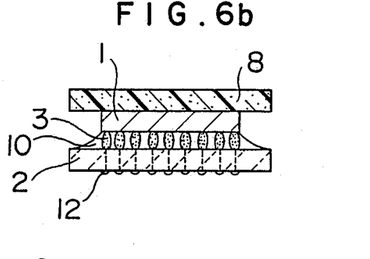
Figure 6C:
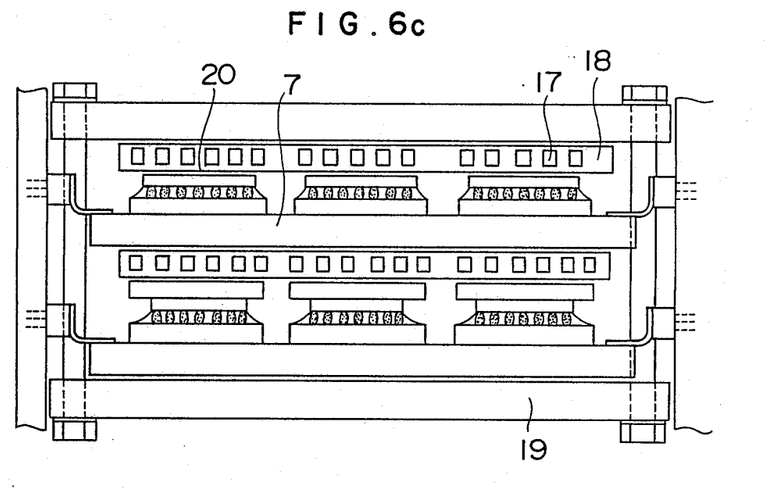
FIG. 6c is a cross-sectional view of a stud type multi-stage module, on which the package structures indicated in FIG. 6a and 6b are mounted.

FIG. 6c is a cross-sectional view of a stud type multi-stage module, on which the package structures indicated in FIG. 6a and 6b are mounted. Elements of the structure model indicated in FIG. 6a are mounted on the upper stage and element of the structure model indicated in FIG. 6b are mounted on the lower stage, where each of the packages are pressed uniformly through a heat conductive plane plate 18 for water cooling 17 by a press plate 19 by means of a spring. The rear surface of the chip of the structure indicated in FIG. 6a and the cooled surface of the structure indicated in FIG. 6b are brought into contact with the heat conductive plane plate for water cooling or adhered with heat conductive grease therewith. However, since there is no strong restriction between different packages and therefore the resistance against thermal fatigue is maintained.

In addition the upper surface of each of the packages is made forcedly flat during bonding, because it should be on a plane.

Figure 7A:
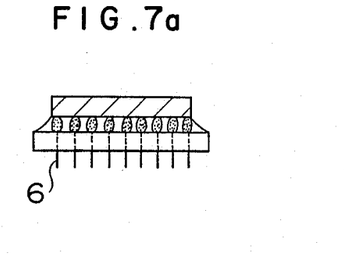
FIGS. 7a and 7b are cross-sectional views illustrating two different pin lead type package structures, to which the semiconductor resin package structure according to this invention is applied.
Figure 7B:
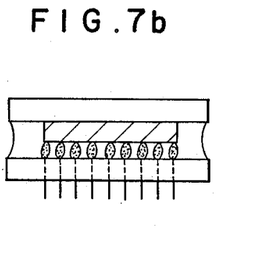

FIGS. 7a and 7b illustrate two different pin lead type package structures for which a mounting method similar to that indicated in FIG. 6c is possible. FIG. 7a illustrates a structure in which the resin is adhered not only to the lower surface of the chip but also to the side surface of the chip, and FIG. 7b illustrates a structure in which the resin covers the part around and below the rear surface of the chip. The material of the chip is not limited to Si, but it can be GaAs, and the active elements include all the mounted chips. This is the same for other elements such as C, R, etc.

Figure 8:
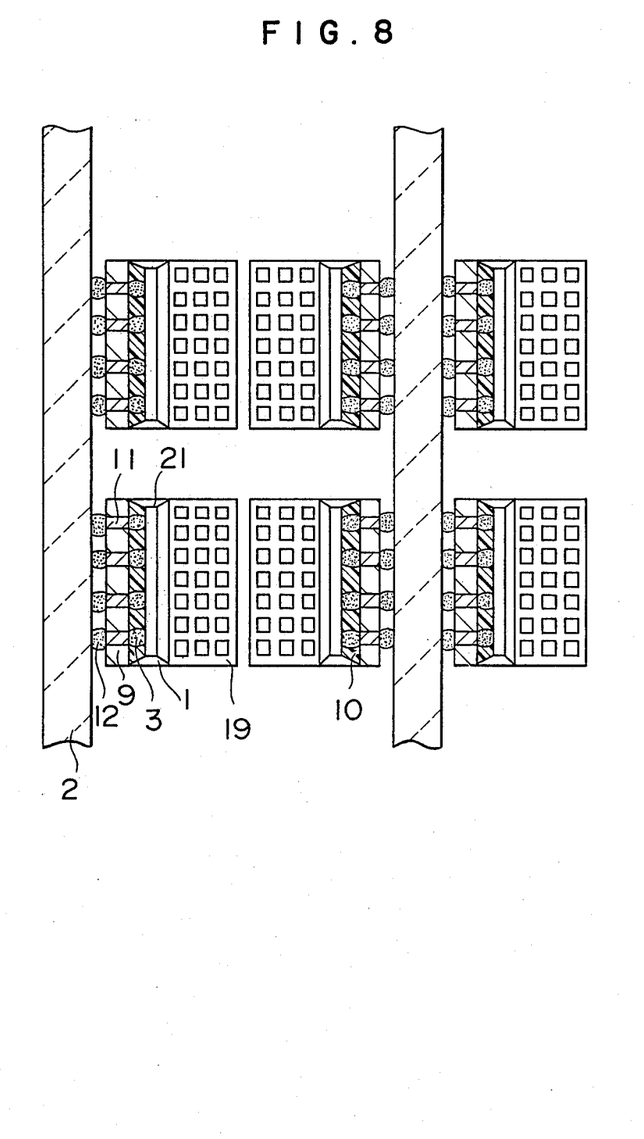
FIG. 8 is a cross-sectional view of a module mounting structure, in which the semiconductor resin package structure according to this invention is used, applied to the boiling cooling method using liquid freon.

FIG. 8 illustrates an example, in which this invention is applied to the boiling cooling method using liquid freon. A stud type fin 19 is jointed to the rear surface of the chip. Since chips can be mounted on both the surfaces of the multi-layer substrate, this method is better in the packing density and the facility of the cooling than the water cooling method.

A ceramic substrate, whose main component is Al$_2$O$_3$, etc., is used as the multi-layer substrate 2. The portion, where freon comes into contact with metal, is the solder portion 12, which is necessary for exchanging chips. (The side surface of the Si chip is covered with resin 21 for protection.) Since the corrosion of the solder Pb-60% Sn is at a level permitting to guarantee a life of 15 years under the working condition of computers according to results of an acceleration test, the cooling in liquid freon according to this method is allowed.

The effect of this method consists in the high density mounting and the facility of the cooling.

Figure 9A:
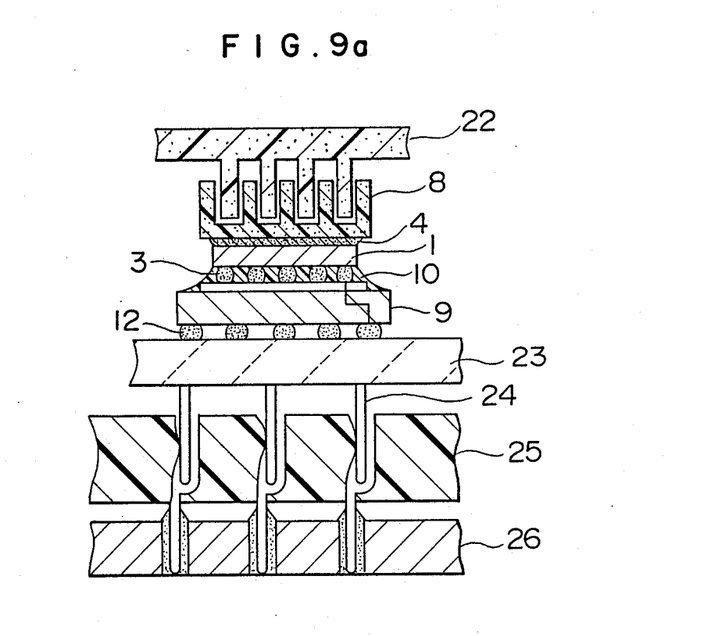
FIG. 9a is a cross-sectional view of a chip carrier structure, in which a resistance for impedance matching is formed on the surface of the carrier plate.
Figure 9B:
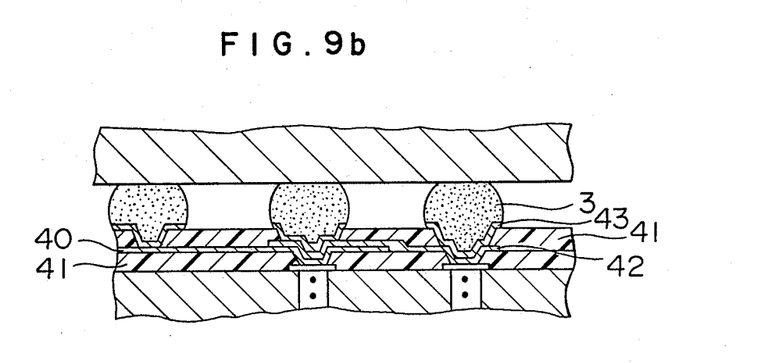

FIG. 9a illustrates a chip carrier structure, in which a resistance having a predetermined impedance for impedance matching is mounted on the surface of the carrier substrate 9 and FIG. 9b is an enlarged scheme of a part of the surface of the carrier substrate 9. In FIG. 9a the reference numeral 22 represents a housing. The carrier substrate 9 is soldered to a board 23 and connected with a multi-layer printed board 26 through pins 24 and a connector 25.

As indicated in FIG. 9b, a thin film resistance element 40 (e.g. Cr-SiOO) having a predetermined impedance is formed on the carrier substrate 9, on which a polyimide insulating film 41 and a thin film wiring 42 are formed and which is connected with the silicon chip 1 through the solder bump 3 (Pb-5% Sn). A thin metallize film 43 is formed on the polyimide insulating film 41.

The housing 22 has a Toothed structure corresponding to the Si chip cooling plate 8. A plurality of Si chips 1 are connected with the multi-layer substrate 23 made of ceramic and stored in one housing, in which high pressure He gas is enclosed and which is sealed with the substrate 23 by means of a low melting point solder (e.g. Sn-18% Bi-45% Pb). The housing 22 and the cooling plate 8 are made of ceramic, such as sintered SiC, etc., having a thermal conductivity, which is greater than 0.1 cal/cm.sec.°C. at the room temperature. In particular, a sintered body made of a non-oxide substance having a thermal conductivity, which is greater than 0.2 cal/cm.sec.°C., is preferably used therefor. Further a heat conductive plane plate 18 for water cooling made of Al, Cu, stainless steel, etc. is jointed through heat conductive grease mechanically or by means of solder to the upper portion of the housing 22. The used plane plate 18 is similar to that indicated in FIG. 6c or FIG. 8. The solder 3 is made of Pb-5% Sn and formed by evaporation in a height of 50-150 μm and the gap is filled with resin 10, as described previously. The solder 12 is made of Pb-60% Sn, whose melting point 1 is lower than that of the solder 3, therefore, the solder 12 is formed in a height, which is about 10-30 μm, smaller than that of the solder 3. Also the solder 12 is made by the dip soldering in a flowing solder bath. Thus it permits to reform the solder 12 and to repair it. For the carrier substrate 9 is used a single layer or multi-layer plate made of a ceramic sintered substance. For the metallization on the solder forming surface is used a metallize layer formed by baking a material, whose principal component is W powder and Mo powder. Thus the metallization layer stands its thermal hysteresis provokes by repair. Both the carrier substrate 9 and the ceramic multi-layer plate 23 are made of sintered mullite. On the multi-layer plate 23 are disposed electrically conductive metal pins 24. The reference numeral 26 represents a printed circuit multi-layer board made of polyimide resin.

We claim:

1. A semiconductor resin package structure formed according to flip-chip connection method and permitting the rear surface of a semiconductor chip to be cooled, comprising:
   a semiconductor chip; and
   a carrier substrate which is solder on one surface thereof to electrodes of a front face of said semiconductor chip according to the flip-chip connection method wherein solder connections extend from the carrier substrate to electrodes on said semiconductor chip to form a gap between the carrier substrate and the semiconductor chip, the gap between said semiconductor chip and said carrier substrate being filled with resin having a thermal expansion coefficient which is equal to that of the solder forming the solder connections, the electrodes of said semiconductor chip being electrically connected with terminals on the other surface of said carrier substrate through the solders connections and at least one through-hole conductor disposed within said carrier substrate, the thermal expansion coefficient of said carrier substrate being approximately equal to that of a multi-layer substrate, with which said carrier substrate is connected by soldering with said terminals; solder for connecting said carrier substrate with said multi-layer substrate having a melting point that is lower than the melting point of the solder for connecting said semiconductor chip with said carrier substrate.

2. A semiconductor resin package structure according to claim 1, wherein the bending rigidity of said carrier substrate is so great that the bending rigidity of said semiconductor chip can be neglected with respect thereto.

3. A semiconductor resin package structure according to claim 1, wherein said resin is epoxy resin containing quartz powder of 30-60 vol. %.

4. A semiconductor resin package structure according to claim 3, wherein said resin contains polybutadiene of 5-15 wt. %.

5. A semiconductor package structure according to claim 1, wherein inorganic filler is included in said resin to make thermal coefficient of said resin low as a whole.

6. A semiconductor package structure according to claim 7, wherein said inorganic filler is quartz powder.

7. A semiconductor package structure according to claim 1, wherein said resin covers the part below a rear surface of said semiconductor chip.

8. A semiconductor package structure according to claim 1 wherein a rear surface of said semiconductor chip is soldered with a heat conductive plate whose size is larger than that of said semiconductor chip.

9. A semiconductor package structure according to claim 1, wherein a rear surface of said semiconductor chip is adhered with a heat conductive plate whose size is larger than that of said semiconductor chip.

10. A semiconductor package structure according to claim 1, wherein said carrier substrate has function of matching terminal pitch of said semiconductor chip to terminal pitch of said multi-layer when the terminal pitch of said multi-layer is larger than that of said semiconductor chip.

11. A semiconductor resin package structure comprising:
a semiconductor chip; and
a carrier substrate which is soldered on one surface thereof to electrodes of said semiconductor chip according to the flip-chip connection method wherein solder connections extend from the carrier substrate to the electrodes of said semiconductor chip to form a gap between the carrier substrate and the semiconductor chip, the gap between said semiconductor chip and said carrier substrate being filled with resin having a thermal expansion coefficient which is equal to that of the solder forming the solder connections, the electrodes of said semiconductor chip being electrically connected with terminals of the other surface of said carrier substrate through the solder connections and at least one through-hole conductor disposed on said carrier substrate, the thermal expansion coefficient of said carrier substrate being approximately equal to that of a multi-layer substrate, with said carrier substrate is connected by soldering with said terminals; solder for connecting said carrier substrate with said multi-layer substrate having a melting point that is lower than the melting point of the solder for connecting said semiconductor chip with said carrier substrate.

12. A semiconductor mounting structure comprising:
at least one semiconductor package structure formed according to flip-chip connection method and adopted to be cooled at the rear surface of semiconductor chip, each package including
a semiconductor chip, and
a carrier substrate which is soldered on one surface thereof to electrodes of said semiconductor chip according to the flip-chip connection method, the gap between said semiconductor chip and said carrier substrate being filled with resin having a thermal expansion coefficient, which is equal to that of used solder, the electrodes of said semiconductor chip being electrically connected with terminals on the other surface of said carrier substrate through the solder portions and a through-hole conductor disposed on said carrier substrate;
a multi-layer substrate who which said carrier substrate is connected by soldering with said terminals, with solder whose melting point is lower than the melting point of the solder for connecting said carrier substrate with said multi-layer substrate, the thermal expansion coefficient of said carrier substrate being approximately equal to that of said carrier substrate; and
means for cooling the rear side of the semiconductor chips.

13. A semiconductor package structure formed according to flip-chip connection method and permitting to cool the rear surface of semiconductor chip, comprising:
a semiconductor chip, and
a carrier substrate which is soldered on one surface thereof to electrodes of said semiconductor chip according to the flip-chip connection method, the gap between said semiconductor chip and said carrier substrate being filled with resin having a thermal expansion coefficient, which is equal to that of used solder, the electrodes of said semiconductor chip being electrically connected with pin leads provided in said carrier substrate by solder, the thermal expansion coefficient said carrier substrate being approximately equal to that of a multi-layer substrate, with which said carrier substrate is connected by inserting said pin leads therein.

14. A semiconductor package structure according to claim 13, wherein said resin is adhered not only to the lower surface of said semiconductor chip but also to the side surface of said semiconductor chip.

15. A semiconductor package structure according to claim 13, wherein said resin covers the part around and below the rear surface of said semiconductor chip.

16. A semiconductor package structure according to claim 13, wherein inorganic filler is included in said resin to make thermal expansion of said resin as a whole.

17. A semiconductor package structure according to claim 13, wherein said inorganic filler is quartz powder.

18. A semiconductor package structure formed according to flip-chip connection method and adapted to be cooled at the rear surface of semiconductor chip, each package including
a semiconductor chip, and
a carrier substrate which is soldered on one surface thereof to electrodes of said semiconductor chip according to the flip-chip connection method, the gap between said semiconductor chip and said carrier substrate being filled with resin having a thermal expansion coefficient, which is equal to that of used solder, the electrodes of said semiconductor chip being electrically connected with pin leads provided in said carrier substrate by solder;
a multi-layer substrate to which said carrier substrate is connected by inserting said pin leads therein, the thermal expansion coefficient of said carrier substrate being approximately equal to that of said carrier substrate; and
means for cooling the rear side of the semiconductor chips.

19. A semiconductor package structure formed according to flip-chip connection method and permitting to cool the rear surface of semiconductor chip, comprising:
a semiconductor chip, and
a carrier substrate which is soldered on one surface thereof to electrodes of said semiconductor chip according to the flip-chip connection method, the electrodes of said semiconductor chip being electrically connected with pin leads provided in said carrier substrate by solder, the thermal expansion coefficient, which is equal to that of a multi-layer substrate, with which said carrier substrate is connected by inserting pin leads therein.

20. A semiconductor mounting structure comprising:
at least one semiconductor package structure formed according to flip-chip connection method and adapted to be cooled at the rear surface of semiconductor chip, each package including:
a semiconductor chip, and a carrier substrate which is soldered on one surface thereof to electrodes of said semiconductor chip according to the flip-chip connection method, the electrodes of said semiconductor chip being electrically connected with pin leads provided in said carrier substrate by solder;

a multi-layer substrate to which said carrier substrate is connected by inserting pin leads therein, the thermal expansion coefficient, which is equal to that of a multi-layer substrate; and means for cooling the rear side of the semiconductor chip.

* * * * *